SEMICONDUCTOR STRUCTURE HAVING IMPROVED POWER HANDLING AND HEAT DISSIPATION CAPABILITIES

Original Filed March 20, 1964

Inventors:
Reinhard Dahlberg
Dieter Gerstner
Walter Klossika

By: Spencer & Kaye
ATTORNEYS

United States Patent Office 3,400,311
Patented Sept. 3, 1968

3,400,311

SEMICONDUCTOR STRUCTURE HAVING IMPROVED POWER HANDLING AND HEAT DISSIPATION CAPABILITIES

Reinhard Dahlberg, Dieter Gerstner, and Walter Klossika, Heilbronn (Neckar), Germany, assignors to Telefunken Patentverwertungs-G.m.b.H., Ulm (Danube), Germany Continuation of application Ser. No. 353,491, Mar. 20, 1964. This application Mar. 1, 1967, Ser. No. 619,875
Claims priority, application Germany, Mar. 21, 1963, T 23,669
13 Claims. (Cl. 317—235)

ABSTRACT OF THE DISCLOSURE

A power transistor composed of a plurality of low-power transistor elements disposed in a common housing and each having an emitter resistor, all of the elements being connected together for parallel operation as a single transistor, and all of the elements preferably being mounted on a common heat sink.

This is a continuation of application Ser. No. 353,491, filed on Mar. 20, 1964, and now abandoned.

The present invention relates generally to the semiconductor art, and, more particularly, to a semiconductor arrangement which includes several semiconductor elements and especially transistors and/or diodes which are connected together and disposed within a common housing.

In order to increase the power handling capability of such an arrangement, the active semiconductor surfaces can be enlarged. However, with an enlargement of the areas the yield goes down. Also, no sufficient increase in power handling capability is obtained by the thermal couplings of the individual elements which results from simply housing several semiconductor elements in a common housing.

With these problems of the art in mind, it is a main object of the present invention to provide a semiconductor arrangement wherein several semiconductor elements are connected together and disposed within a common housing and wherein their power handling capability is increased.

Another object of the invention is to provide a device of the character described wherein the entire electrical power loss is distributed among the individual elements as uniformly as possible.

Still a further object of the invention is to provide an arrangement wherein the maximum power handling capability in the form of heat dissipation is increased substantially.

These objects and others ancillary thereto are accomplished in accordance with preferred embodiments of the present invention wherein the uniform distribution of the electrical power loss or load is accomplished in a surprising manner by the substantial electrical decoupling of the individual elements from one another. A further improvement is obtained by using semiconductor elements which are substantially identical with one another insofar as their electrical characteristics are concerned. If additional measures are taken to increase the thermal coupling of the individual elements, then a maximum in power dissi pation is accomplished with an arrangement having the smallest volume.

The electrical decoupling of the elements can be accomplished, for example, by connecting resistors in the electrode leads. In using transistors, these resistors are preferably connected to the emitter lead. Capacitors may be connected in parallel with these resistors in order to improve the high frequency characteristics. All in all, it has been found that the better the thermal coupling of the individual elements, the less is the electric decoupling which is required, because of the relationship between electrical and thermal coupling.

The desired uniform distribution of the power loss or load on the individual elements can be improved by using a common mounting plate for all of the elements because the individual elements are thermally coupled with one another by being mounted to the common base plate. The elements are preferably soldered to the common plate. It is also possible to solder the elements to the common mounting plate by one of their electrodes. For example, with alloyed transistors, the collector alloying pills of the elements are soldered to the common mounting place for this purpose. The base of the common housing, for example, may be used as the common mounting plate.

In a further feature of the invention, the electrode leads are, at the same time, constructed as electric fuses and the uniform distribution of the load is also maintained at the time an element fails to operate.

Additional objects and advantages of the present invention will become apparent upon consideration of the following description when taken in conjunction with the accompanying drawings in which.

Figure 1:
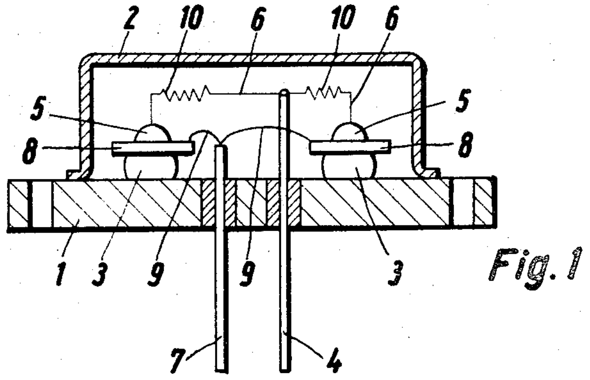
FIGURE 1 is a vertical sectional diagrammatic view through one embodiment of the present invention.

With more particular reference to the drawings, FIGURE 1 illustrates an arrangement wherein two alloy-type transistors are connected in parallel with each other. The transistors are arranged in a housing which includes a housing base plate 1 and housing lid or cover 2. The two transistors are specially selected devices or elements which are very substantially identical to each other insofar as their electrical characteristics are concerned.

When two transistors are provided in a common housing there is the advantage that they are better thermally coupled than transistors which have individual housings, that is, those in which each as its own housing. The thermal coupling can even be increased if the transistors are, as shown in FIGURE 1, soldered to a common base plate. In the embodiment of FIGURE 1 the soldering of the transistors is performed using collector pills 3 soldered to the housing base plate 1. Both transistors have a common emitter connection or post 4 to which the emitter pills 5 are connected by means of electrode leads 6. In addition, a common base post or connection 7 is provided which contacts the two semiconductor bodies 8 via the electrode leads 9.

The transistors shown in FIGURE 1 are electrically decoupled by means of decoupling resistors 10 connected in the emitter leads 6. In the same manner, *n* transistor systems can be provided in a common housing instead of the above-described two transistors. The optimum designing or dimensioning of the values of the decoupling resistors is determined empirically.

Tests have shown that above all a minimal value of resistance should be maintained. In contradistinction to this, it is not as critical if the resistance is made larger. For example, in an arrangement consisting of several five-watt single transistors according to the invention the use of a resistor of 0.1 ohm in the emitter lead of each transistor is recommended.

Figure 2:
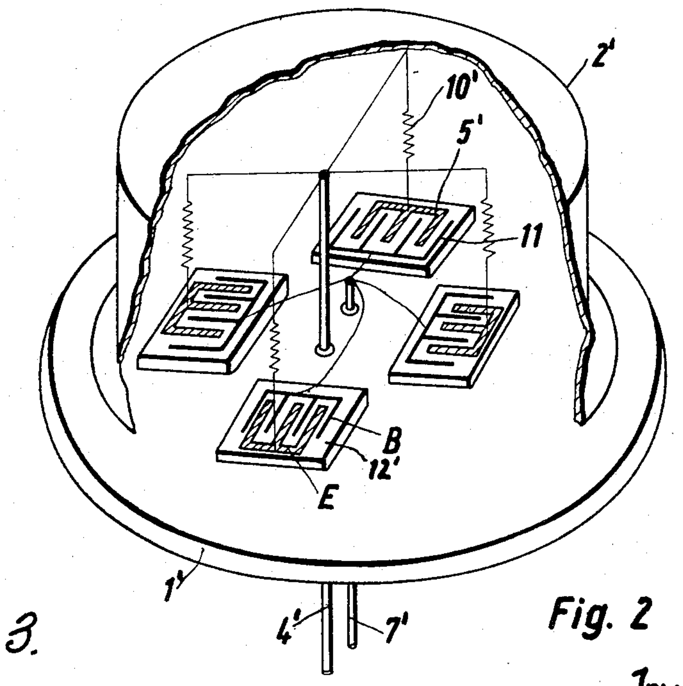
FIGURE 2 is a perspective diagrammatic view, partially broken away for purposes of clarity, and illustrating another embodiment of the invention.

With more particular reference to FIGURE 2, an arrangement is illustrated which includes four transistors each transistor allowing a power handling capability of about 25 watts. The n-type silicon semiconductor bodies 12' of the transistors have a size of about 1 x 1 mm.². The emitter and base electrodes 5' and 11, respectively, are comb-shaped. Both electrodes are formed by evaporation of aluminum. Using a n-type silicon body the base region contacted by the base electrode can be formed by diffusion of boron. For the diffusion of the emitter zone phosphorous may be used.

The transistors of the arrangement of FIGURE 2 are also thermally coupled because their semiconductor bodies are provided in a common housing and are soldered to the well heat conducting common housing plate 1' consisting for example of molybdenum or an iron nickel alloy. Electrical decoupling of these transistors is obtained with the use of resistors 10' of 0.1 ohm in the emitter leads. The decoupling elements 10' can also have the function of fuses.

The emitter electrodes E are connected in parallel with one another on the one hand, and the base electrodes B on the other hand have common base leads similar to the arrangement of FIGURE 1, and the post or connection 4' is provided for the emitters and the post or connection 7' is provided for the bases. The common housing includes a housing lid or cover 2' and a housing base plate 1', and in this respect is similar to FIGURE 1.

Figure 3:
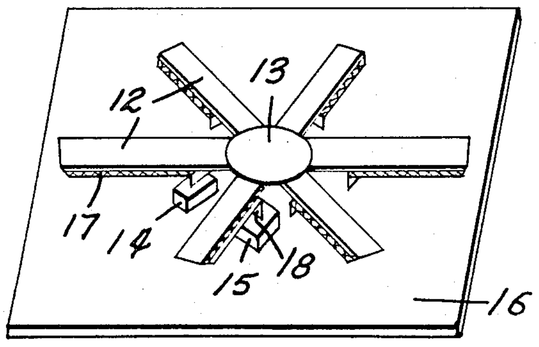
FIGURE 3 is a schematic perspective view of another embodiment of the invention with the housing cover removed.

The arrangement of FIGURE 3 is shown schematically and the housing has been omitted for purposes of clarity. Six electrode leads 12 are provided which can be used to contact the individual elements of a semiconductor arrangement in accordance with the invention. All of the electrode leads shown in FIGURE 3 extend from a common electrode terminal 13 and project outwardly therefrom toward the individual semiconductor elements in a star-shaped manner. For simplicity, only two elements 14 and 15 are illustrated and these are soldered to a common base plate 16.

The strip-like electrode leads 12 are folded to form a double strip and a dielectric material 17 is provided between the layers and this may, for example, be mica. Because of these arrangements, these leads have the property of the decoupling resistors because if a dielectric material is positioned between the strip-like portions of these electrode leads, the electrode leads not only have an ohmic but also a capacitative effect. Such electrode leads can always be used in place of electrode leads with ohmic and capacitative resistors connected in parallel.

The contacting of the electrodes of the individual semiconductor elements takes place by using strip-like leads and with the aid of strip-ends 18, and these ends are bent at an angle for the purpose of soldering them together with the semiconductor electrodes.

It will be understood that the above description of the present invention is susceptible to various modifications, changes and adaptations, and the same are intended to be comprehended within the meaning and range of equivalents of the appended claims.

We claim:

1. A power transistor comprising, in combination:

(a) a housing;

(b) a plurality of substantially similar individual transistor elements disposed in said housing and each having an emitter, a base and a collector;

(c) a plurality of emitter resistors, one for each said transistor element, each connected in series with the emitter of its respective transistor element for equalizing the power distribution between said elements; and (d) first connecting means electrically connecting together the collectors of all of said transistor elements and constituting the collector terminal for said power transistor, second connecting means electrically connecting together all of the bases of said transistor elements and constituting the base terminal for said power transistor, and third connecting means electrically connecting together the free ends of all of said emitter resistors and constituting the emitter terminal for said power transistor, whereby all of said elements are connected to operate in parallel.

2. An arrangement as defined in claim 1 wherein said semiconductor elements are identical with one another with respect to their electrical characteristics.

3. An arrangement as defined in claim 1 further comprising a plurality of leads each connected to a respective electrode of one said transistor element, at least some of said leads being constituted as electric fuses.

4. An arrangement as defined in claim 1 wherein said housing includes a common base plate on which all of said transistors are mounted for increasing their thermal coupling.

5. An arrangement as defined in claim 4 wherein said transistors are alloyed transistors the collector of each of which is constituted by a collector alloying pill soldered to said base plate.

6. An arrangement as defined in claim 4 wherein said transistors are diffused base transistors the collector of each of which is constituted by a collector zone soldered to said base plate.

7. An arrangement as defined in claim 1 wherein each of said resistors comprises a connecting strip forming a lead of a respective one of said elements.

8. An arrangement as defined in claim 7 wherein each said strip is folded to form a two-layer strip, and wherein each said resistor further comprises a dielectric body disposed between said layers.

9. A semiconductor device comprising, in combination:

(a) a housing;

(b) a plurality of interconnected semiconductor diode elements disposed in said housings; and (c) a plurality of resistors connected between said elements, each said resistor being composed of a connecting strip of resistive material forming a lead of a respective one of said diodes.

10. A semiconductor device comprising, in combination:

(a) a housing;

(b) a plurality of interconnected transistor elements each having a base, a collector and an emitter; and (c) a plurality of resistors connected between said elements each said resistor being composed of a connecting strip of resistive material forming a lead of a respective one of said transistors.

11. A semiconductor device, comprising, in combination:

(a) a housing;

(b) a plurality of interconnected semiconductor elements disposed in said housings; and (c) a plurality of resistors connected between said elements, each said resistor including a folded two-layer connecting strip forming a lead of a respective one of said elements, and a dielectric body disposed between the two layers of said strip.

12. An arrangement as defined in claim 11 wherein each said body is made of mica.

13. An arrangement as defined in claim 11 wherein each said strip has one end bent at an angle and soldered to the associated electrode of its respective element.

References Cited

UNITED STATES PATENTS

| | | | |
|---|---|---|---|
| 2,663,806 | 12/1953 | Darlington | 307—88 |
| 2,751,545 | 6/1956 | Chase | 307—88.5 |
| 2,816,964 | 12/1957 | Giacoletto | 307—88.5 |
| 3,226,603 | 12/1965 | Finn et al. | 317—101 |
| 3,231,794 | 1/1966 | Diebold | 317—234 |
| 3,264,531 | 8/1966 | Dickson | 317—234 |

JOHN W. HUCKERT, *Primary Examiner.*

R. F. SANDLER, *Assistant Examiner.*